United States Patent
Chien et al.

(10) Patent No.: US 6,258,705 B1
(45) Date of Patent: Jul. 10, 2001

(54) METHOD OF FORMING CIRCUIT PROBING CONTACT POINTS ON FINE PITCH PERIPHERAL BOND PADS ON FLIP CHIP

(75) Inventors: Feng-Lung Chien, Taichung; Randy H.Y. Lo, Taipei; Chun-chi Ke, Taichung Hsien, all of (TW)

(73) Assignee: Siliconeware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 09/642,319

(22) Filed: Aug. 21, 2000

(51) Int. Cl.⁷ ................................................. H01L 21/44
(52) U.S. Cl. ........................................... 438/614; 438/648
(58) Field of Search ................................. 438/614, 648, 438/656, 685, 687; 257/638, 704

(56) References Cited

U.S. PATENT DOCUMENTS

| | | | |
|---|---|---|---|
| 4,927,505 | 5/1990 | Sharma et al. | 204/34.5 |
| 5,137,845 | 8/1992 | Lochon et al. | 437/183 |
| 5,369,299 | * 11/1994 | Byrne | 257/638 |
| 5,563,102 | * 10/1996 | Michael | 437/209 |
| 5,736,456 | 4/1998 | Akram | 438/614 |
| 5,773,359 | 6/1998 | Mitchell et al. | 438/614 |
| 5,902,686 | 5/1999 | Mis | 428/629 |
| 5,903,058 | 5/1999 | Akram | 257/778 |
| 5,904,859 | 5/1999 | Degani | 216/18 |
| 6,015,652 | 1/2000 | Ahlquist et al. | 430/315 |

* cited by examiner

Primary Examiner—David Nelms
Assistant Examiner—David Vu
(74) Attorney, Agent, or Firm—Dike, Bronstein, Roberts & Cushman, IP Group of Edwards & Angell, LLP; Peter F. Corless

(57) ABSTRACT

A method is proposed for forming circuit probing (CP) contact points on fine pitch peripheral bond pads (PBP) on a flip chip for the purpose of facilitating peripheral circuit probing of the internal circuitry of the flip chip. The proposed method is characterized in the forming of a dual-layer NiV/Cu metallization structure, rather than a triple-layer Al/NiV/Cu metallization structure, over each aluminum-based PBP, which includes a bottom layer of nickel-vanadium (NiV) deposited over the aluminum-based PBP and an upper layer of copper (Cu) deposited over the nickel-vanadium layer. When low-resolution photolithographic and etching equipment is used for photoresist mask definition for selective removal of the NiV/Cu metallization structure, the resulted photoresist masking can be misaligned to the PBP. However, since no aluminum layer is included in the metallization structure, a Cu/NiV specific etchant would only etch away the copper layer and the nickel-vanadium layer but not the aluminum-based PBP, thus leaving the unmasked portion of the aluminum-based PBP intact.

4 Claims, 7 Drawing Sheets

METHOD OF FORMING CIRCUIT PROBING CONTACT POINTS ON FINE PITCH PERIPHERAL BOND PADS ON FLIP CHIP

BACKGROUND OF THE INVENTION

1. Field of the Invention

This invention relates to semiconductor fabrication technology, and more particularly, to a method of forming circuit probing (CP) contact points on fine pitch peripheral bond pads (PBP) on a flip chip for the purpose of facilitating peripheral circuit probing of the internal circuitry of the flip chip.

2. Description of Related Art

The flip-chip technology is an advanced semiconductor fabrication technology that allows the overall package size to be made very compact. The flip-chip package configuration differs from conventional ones particularly in that it mounts the semiconductor chip in an upside-down manner over the chip carrier and electrically coupled to the same by means of solder bumps provided on the active surface of the semiconductor chip. Since no bonding wires are required, which would otherwise occupy much layout space, the overall size of the flip-chip package can be made very compact as compared to conventional types of semiconductor device packages.

The attachment of solder bumps to a flip chip requires the provision of the so-called UBM (Under Bump Metallization) pads on the active surface of the semiconductor chip, which is wettable to the solder bumps so that the solder bumps can be securely attached to the flip chip.

A great variety of patented technologies have been proposed for the fabrication of UBM pads on a flip chip. A few of these patented technologies are listed in the following:

U.S. Pat. No. 5,904,859 entitled "FLIP CHIP METALLIZATION";

U.S. Pat. No. 5,902,686 entitled "METHODS FOR FORMING AN INTERMETALLIC REGION BETWEEN A SOLDER BUMP AND AN UNDER BUMP METALLURGY LAYER AND RELATED STRUCTURES";

U.S. Pat. No. 6,015,652 entitled "MANUFACTURE OF FLIP-CHIP DEVICE";

U.S. Pat. No. 5,137,845 entitled "METHOD OF FORMING METAL CONTACT PADS AND TERMINALS ON SEMICONDUCTOR CHIPS"

U.S. Pat. No. 5,773,359 entitled "INTERCONNECTION SYSTEM AND METHOD OF FABRICATION";

U.S. Pat. No. 5,736,456 entitled "METHOD OF FORMING CONDUCTIVE BUMPS ON DIE FOR FLIP CHIP APPLICATIONS";

U.S. Pat. No. 4,927,505 entitled "METALLIZATION SCHEME PROVIDING ADHESION AND BARRIER PROPERTIES";

U.S. Pat. No. 5,903,058 entitled "CONDUCTIVE BUMPS ON DIE FOR FLIP CHIP APPLICATION".

Siliconware Precision Industries Co., Ltd., (SPIL), which is Applicant of this invention, presently utilizes a triple-layer UBM structure for flip chip application, which includes a bottom layer of aluminum (Al), an intermediate layer of nickel-vanadium (NiV), and an upper layer of copper (Cu). The use of this Al/NiV/Cu metallization structure, however, would result in a fabrication problem when it is also used for the forming of an array of circuit probing contact points on peripheral bond pads on the flip chip that are spaced at a fine pitch of less than 70 μm (micrometer), typically 60 μm or 50 μm. This fabrication problem is illustratively depicted in the following with reference to FIG. 1, FIG. 2, FIGS. 3A–3G, and FIG. 4.

FIG. 1 is a schematic diagram showing the active surface of a flip chip semiconductor substrate 10 where a plurality of peripheral bond pads (PBP) 11 are formed. In the case of the PBPs 11 being spaced at a fine pitch of less than 70 μm, they would be unsuited for solder-bump attachment due to the fact that solder bumps are relatively large in size and such a fine pitch would make neighboring solder bumps to come in touch with each other. Therefore, as a solution to this problem, the PBPs 11 are redistributed via re-distribution layers (RDL) 12 to new locations called area array pads (AAP) 13.

Referring further to FIG. 2, each PBP 11, RDL 12, and AAP 13 is covered by a passivation layer 20; and a UBM pad 30 is formed over the AAP 13 for attachment to a solder bump 50. This allows the internal circuitry of the semiconductor substrate 10 to be electrically connected to an external printed circuit board (not shown) via the conductive path consisting of the PBP 11, the RDL 12, the AAP 13, the UBM pad 30, and the solder bump 50.

During the flip chip fabrication, it is required to perform a circuit probing (CP) procedure to the semiconductor substrate 10 for the purpose of checking whether the internal circuitry thereof would operate normally. The CP procedure can be performed by using a PBP-dedicated probing card (not shown) which is designed to be electrically coupled to the internal circuitry of the semiconductor substrate 10 via the PBP 11. However, after the PBP 11 is redistributed to the AAP 13 and covered by the passivation layer 20, the PBP-dedicated probing card (not shown) would become useless; and instead, it requires the use of an AAP-dedicated probing card that is specifically designed to be electrically coupled to the internal circuitry of the semiconductor substrate 10 via the AAP 13.

One drawback to the use of the AAP-dedicated probing card, however, is that it is much more expensive to purchase than the PBP-dedicated probing card. Therefore, it would be highly cost-ineffective to perform a CP procedure by using AAP-dedicated probing card.

One solution to the foregoing problem is to break open the part of the passivation layer 20 that is laid directly over the PBP 11 and form an exposed metallization layer (not shown in FIG. 2) over the PBP 11 to serve as a peripheral CP contact point, so that the PBP-dedicated probing card can be nevertheless employable for use to perform a CP procedure to the internal circuitry of the semiconductor substrate 10 without having to purchase expensive AAP-dedicated probing card. A realization of this solution through the Al/NiV/Cu metallization technology is depicted in the following with reference to FIGS. 3A–3G.

Referring to FIG. 3A, in the flip chip fabrication, the first step is to prepare a semiconductor substrate 10, such as a silicon substrate. Next, a PBP 11, an RDL 12, and an AAP 13 are formed from aluminum (Al) at predefined locations on the active surface of the semiconductor substrate 10. The PBP 11, the RDL 12, and the AAP 13 are fabricated through conventional processes which are not within the spirit and scope of the invention, so detailed steps thereof will not be described.

Referring further to FIG. 3B, in the next step, a passivation layer 20 is formed from an electrically-insulative material over the semiconductor substrate 10 to a predefined thickness that allows the passivation layer 20 to cover the entirety of the PBP 11, the RDL 12, and the AAP 13. Further, the passivation layer 20 is selectively removed to form a first opening 21 to expose the PBP 11 and a second opening 22 to expose the AAP 13.

Referring further to FIG. 3C, in the next step, an Al/NiV/Cu metallization structure 30 is formed over the passivation layer 20 to a predefined thickness, which includes an upper layer of copper (Cu) 30a, an intermediate layer of nickel-vanadium (NiV) 30b, and a bottom layer of aluminum (Al) 30c. The Al/NiV/Cu metallization structure 30 is formed by first depositing aluminum over the passivation layer 20 to form the aluminum layer 30c, then depositing nickel-vanadium over the aluminum layer 30c to form the nickel-vanadium layer 30b, and finally depositing copper over the nickel-vanadium layer 30b to form the copper layer 30a.

Referring further to FIG. 3D, in the next step, a photoresist layer 40 is coated over the Al/NiV/Cu metallization structure 30 to a predefined thickness that allows the photoresist layer 40 to cover the entire top surface of the Al/NiV/Cu metallization structure 30. This photoresist layer 40 is then to be selectively removed through a photolithographic and etching process to mask only those portions of the Al/NiV/Cu metallization structure 30 that are laid directly above the PBP 11 and the AAP 13.

In practice, the photolithographic and etching process can be implemented through the use of various kinds of equipment, such as high-resolution stepper and dry-etching machine, or low-resolution aligner and wet-etching machine.

Ideally, as shown in FIG. 4, the photoresist layer 40 should be selectively removed in such a manner as to allow a first remaining photoresist block 41 to be laid directly above the PBP 11 and a second remaining photoresist block 42 to be laid directly above the AAP 13.

The current photolithographic and etching equipment owned by SPIL (Applicant of this invention), however, is a low-resolution aligner and a wet-etching machine, which would only allow precise photoresist masking to the less densely AAPs, but not to the fine pitch PBPs.

Therefore, as shown in FIG. 3E, through the use of the low-resolution photolithographic and etching equipment, only the second photoresist block 42 over the AAP 13 can be aligned to its predefined locations, while the first photoresist block 41 would be misaligned to the PBP 11, thus leaving a small part of the PBP 11 unmasked.

Referring further to FIG. 3F, in the next step, with the first and second photoresist blocks 41, 42 serving as mask, a first etching process is performed by using a NiV/Cu specific etchant, such as a solution of nitric acid and acetic acid ($HNO_3+CH_3COOH$) which can etch into copper and nickel-vanadium but not into aluminum. As a result, this etchant would etch away all the unmasked portions of the copper layer 30a and the nickel-vanadium layer 30b until the aluminum layer 30c is exposed.

Referring further to FIG. 3G, in the next step, with the first and second photoresist blocks 41, 42 still serving as mask, a second etching process is performed by using an aluminum-specific etchant, such as a solution of phosphoric acid and acetic acid. As a result, this etchant would etch away all the unmasked portions of the aluminum layer 30c until the passivation layer 20 is exposed.

However, due to the misalignment of the first photoresist block 41, part of the aluminum-based PBP 11 is unmasked by the first photoresist block 41; and consequently, the aluminum-specific etchant used in the second etching process would undesirably continue to etch into the aluminum-based PBP 11 after the overlying part of the aluminum layer 30c is etched away (the etched portion of the PBP 11 is pointed out by the reference numerals 11a in FIG. 3G). As a result, the aluminum-specific etchant, which is intended to only etch away the unmasked portions of the aluminum layer 30c in the Al/NiV/Cu metallization structure 30, may cause damage to the underlying aluminum-based PBP 11, thus degrading the quality and reliability of the flip chip fabrication.

One solution to the foregoing problem is to purchase high-resolution photolithographic and etching equipment for precise photoresist mask definition. This solution, however, is quite costly to realize.

There exists therefore a need for a semiconductor fabrication process that can be used to form CP contact points on fine pitch PBPs through the use of low-resolution photolithographic and etching equipment without causing damage to the aluminum-based PBPs.

SUMMARY OF THE INVENTION

It is therefore an objective of this invention to provide a method for forming CP contact points on fine pitch PBPs on a flip chip, which can be implemented through the use of low-resolution photolithographic and etching equipment without causing damage to the aluminum-based PBPs In accordance with the foregoing and other objectives, the invention proposes a new method for forming CP contact points on fine pitch PBPs on a flip chip.

The method of the invention is implemented as a semiconductor fabrication process for use to form a circuit-probing contact point over an aluminum-based peripheral bond pad covered by a passivation layer over a flip chip, which comprises the following procedural steps: (1) forming an opening in the passivation layer to expose the aluminum-based peripheral bond pad; (2) forming a NiV/Cu metallization structure including a bottom layer of nickel-vanadium layer deposited over the passivation layer and over the aluminum-based peripheral bond pad through the openings in the passivation layer, and an upper layer of copper deposited over the nickel-vanadium layer; (3) coating a photoresist layer over the NiV/Cu metallization structure; (4) performing a selective removal process on the photoresist layer in such a manner as to allow a remaining photoresist block to mask the part of the NiV/Cu metallization structure that is laid over the aluminum-based peripheral bond pad; and (5) with the remaining photoresist block serving as mask, performing an etching process by using a NiV/Cu specific etchant that can etch into nickel-vanadium and copper but not into aluminum to etch away the unmasked portions of the NiV/Cu metallization structure until exposing the passivation layer and the aluminum-based peripheral bond pad. The remaining portion of the NiV/Cu metallization structure laid over the aluminum-based peripheral bond pad then serves as the intended circuit-probing contact point.

The foregoing method of the invention allows misaligned photoresist masking on PBPs not to cause damage to the unmasked portions of the aluminum-based PBPs when low-resolution photolithographic and etching equipment is used for the photoresist mask definition. This benefit allows the fabrication to use existing low-resolution photolithographic and etching equipment without having to purchase high-definition equipment, thus allowing the fabrication to be cost-effective to implement.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the method of the invention for forming CP contact points on fine pitch PBPs on a flip chip is disclosed in full details in the following with reference to FIGS. 5A–5G.

Figure 5A:
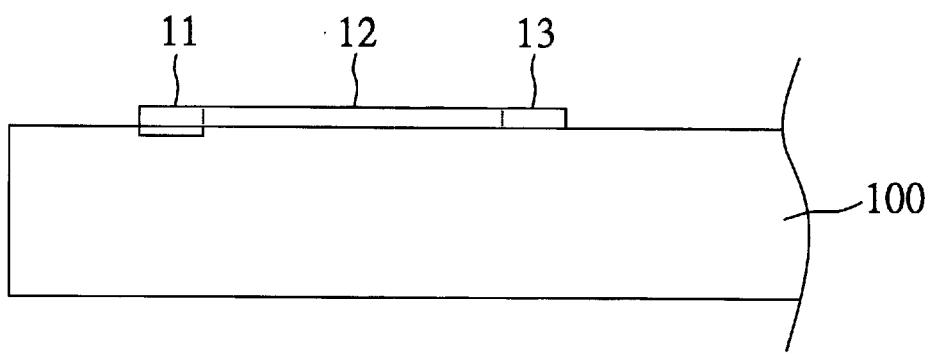
FIGS. 5A–5G are schematic diagrams used to depict the procedural steps involved in the method of the invention for forming CP contact points on fine pitch PBPs on a flip chip.

Referring to FIG. 5A, in the flip chip fabrication, the first step is to prepare a semiconductor substrate 100, such as a silicon substrate. Next, a PBP 111, an RDL 112, and an AAP 113 are formed from aluminum (Al) at predefined locations over the active surface of the semiconductor substrate 100. The PBP 111, the RDL 112, and the AAP 113 are fabricated through conventional processes which are not within the spirit and scope of the invention, so detailed steps thereof will not be described; and in reality, an array of PBPs and AAPs are formed, but since they are all identical in structure, only one is demonstratively shown in FIG. 5A for simplification of drawings and description).

Figure 1:
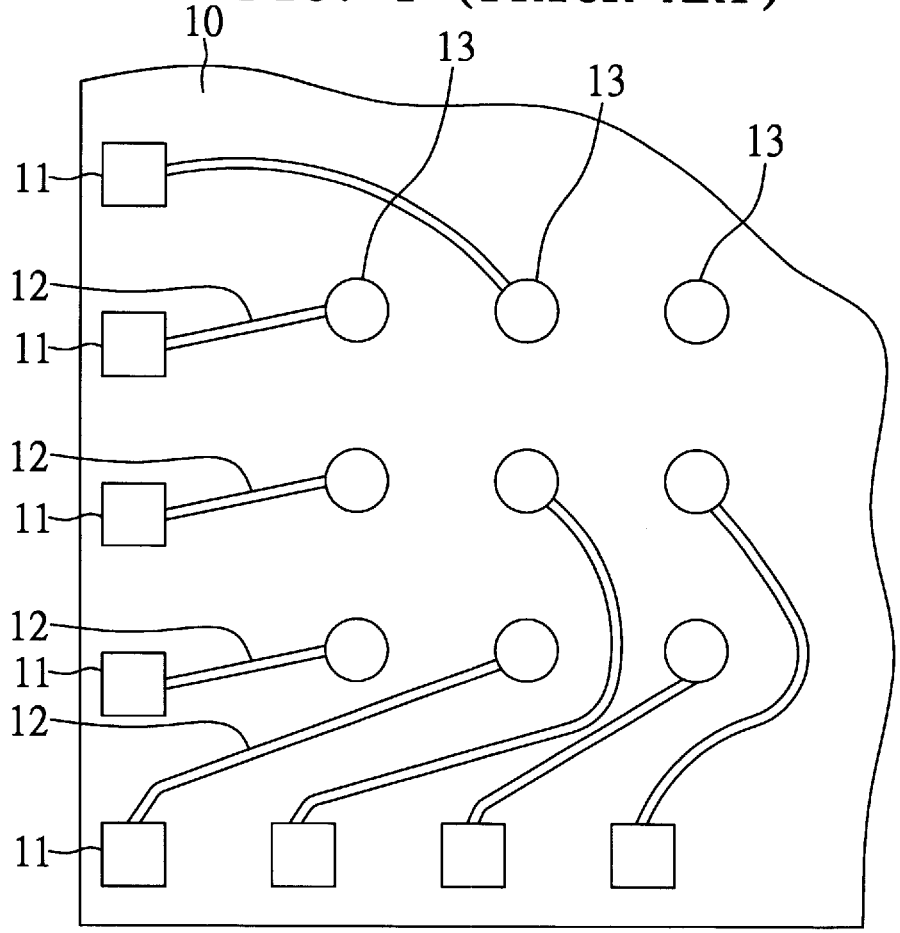
FIG. 1 (PRIOR ART) is a schematic diagram showing the active surface of a flip chip substrate where a plurality of PBPs and AAPs are formed.
Figure 2:
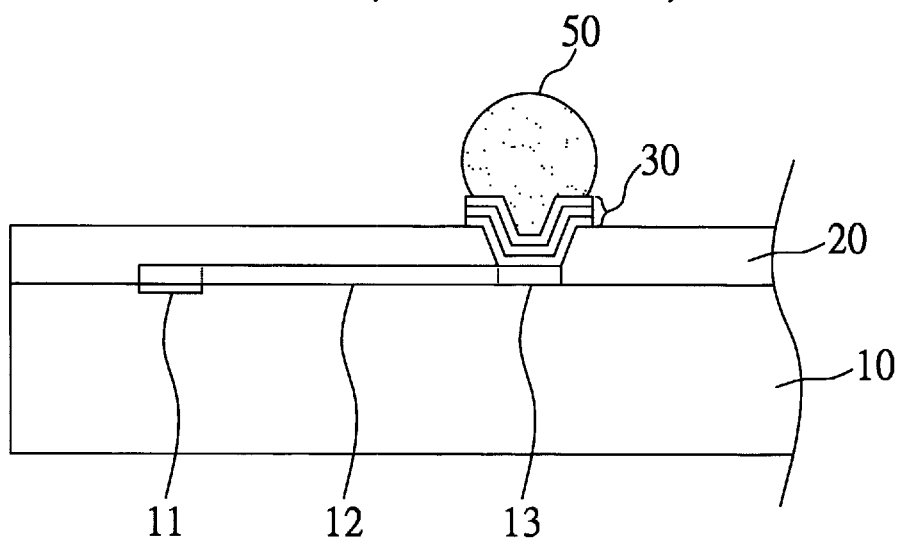
FIG. 2 (PRIOR ART) is a schematic sectional diagram showing the attachment of a solder bump on a UBM pad formed over an AAP.
Figure 3A:
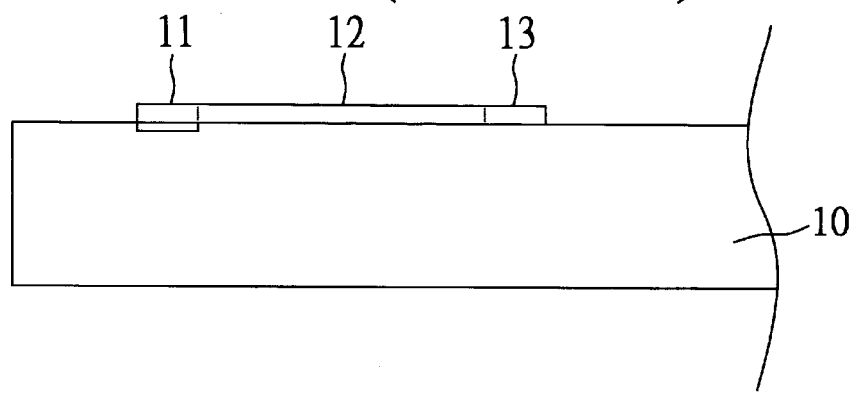
FIGS. 3A–3G (PRIOR ART) are schematic diagrams used to depict the procedural steps involved in a conventional method for forming CP contact points on fine pitch PBPs on a flip chip.
Figure 3B:
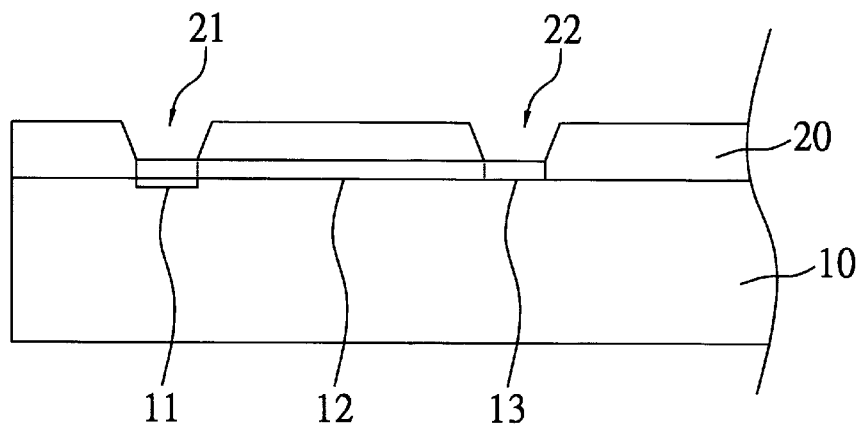
Figure 3C:
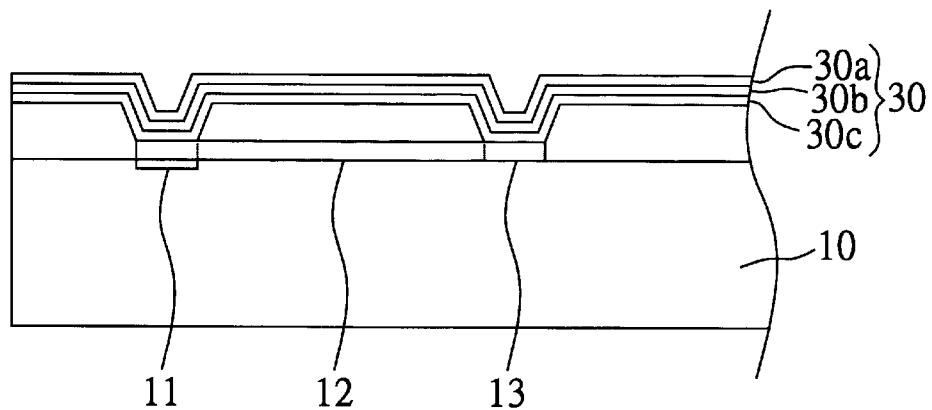
Figure 3D:
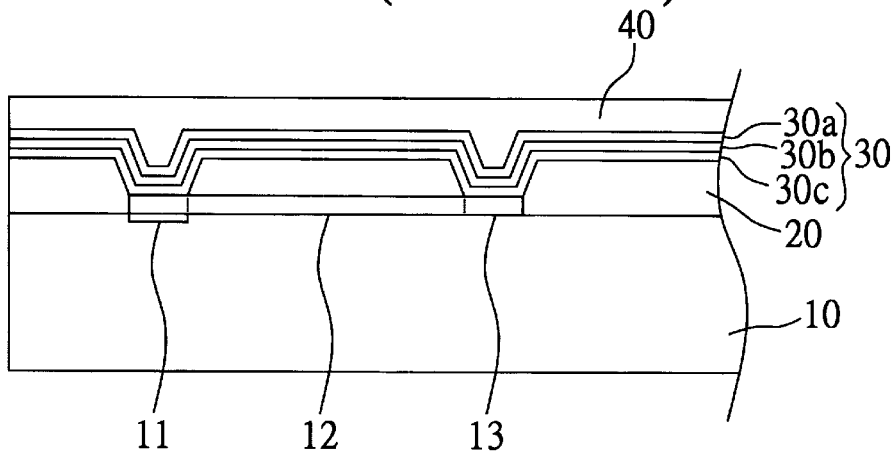
Figure 3E:
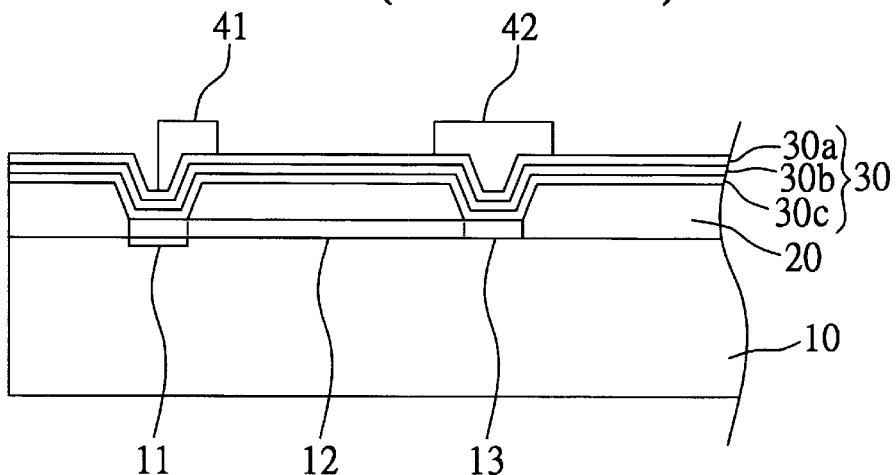
Figure 3F:
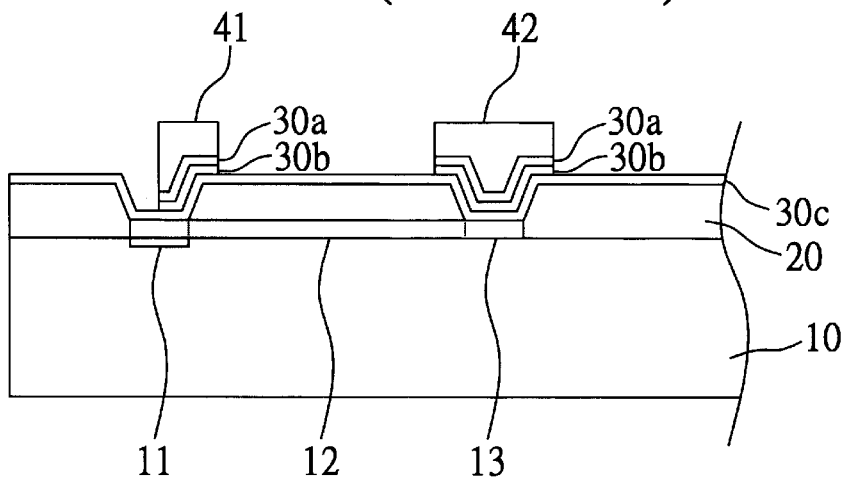
Figure 3G:
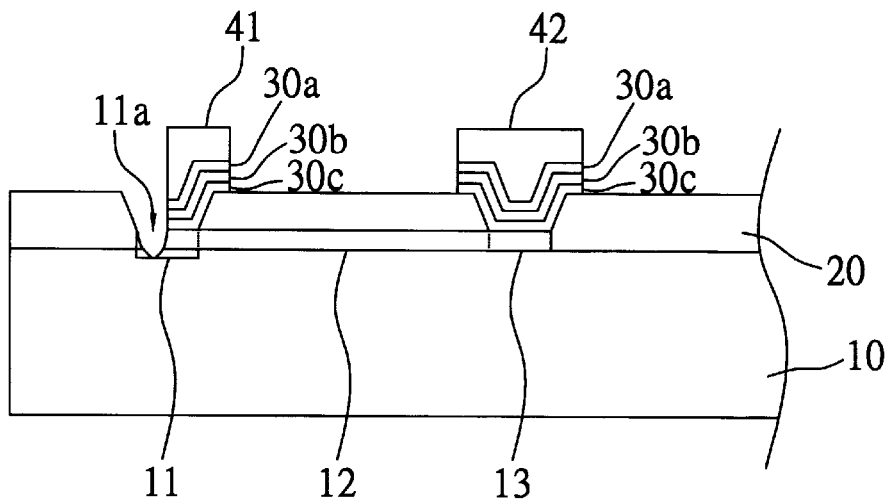
Figure 4:
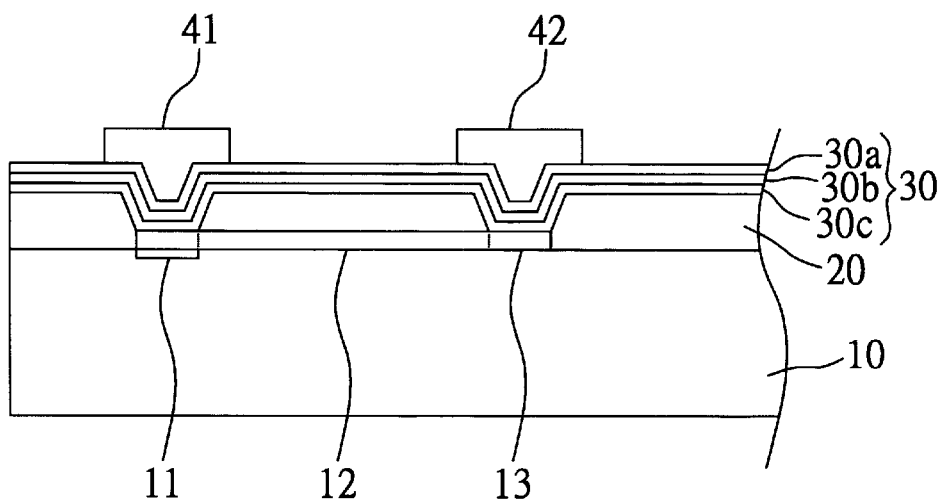
FIG. 4 (PRIOR ART) is a schematic diagram used to illustrate the ideal condition of non-misaligned photoresist mask definition over a metallization structure.
Figure 5B:
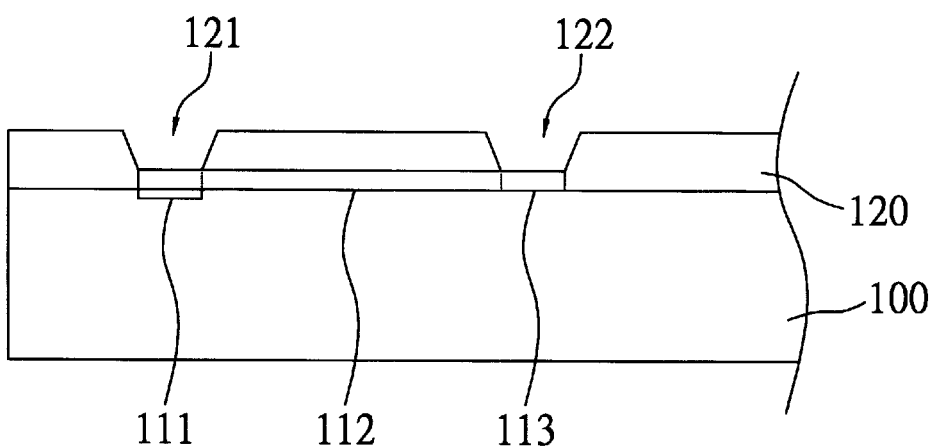
Figure 5C:
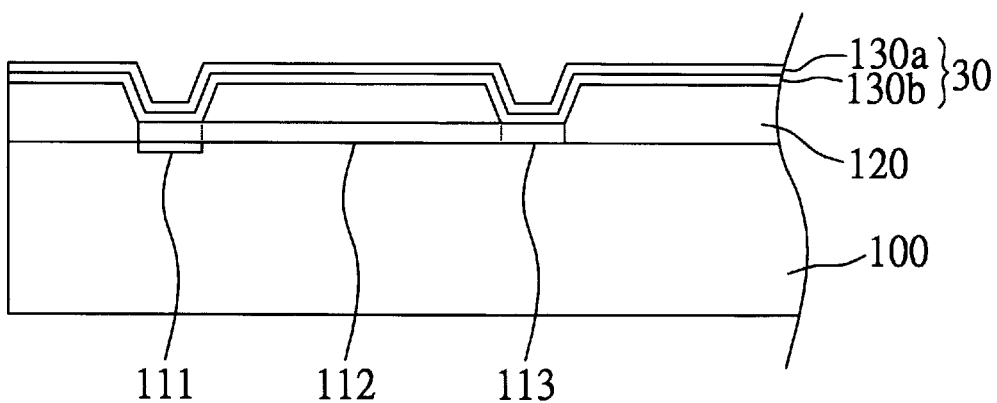

Referring further to FIG. 5B, in the next step, a passivation layer 120 is formed over the semiconductor substrate 100 to cover the entirety of the PBP 111, the RDL 112, and the AAP 113. Further, the passivation layer 120 is selectively removed to form a first opening 121 to expose the PBP 111 and a second opening 122 to expose the AAP 113. Referring further to FIG. 5C, in the next step,, it is a characteristic feature of the invention that a dual-layer NiV/Cu metallization structure 130 (rather than a triple-layer Al/NiV/Cu metallization structure utilized by the prior art of FIGS. 3A–3G) is formed over the passivation layer 120 to a predefined thickness, which includes an upper layer of copper (Cu) 130a and a bottom layer of nickel-vanadium (NiV) 130b. This metallization structure 130 differs from the one utilized by the prior art of FIGS. 3A–3G only in that the bottommost aluminum layer 30c (see FIG. 3C) is here eliminated.

Figure 5D:
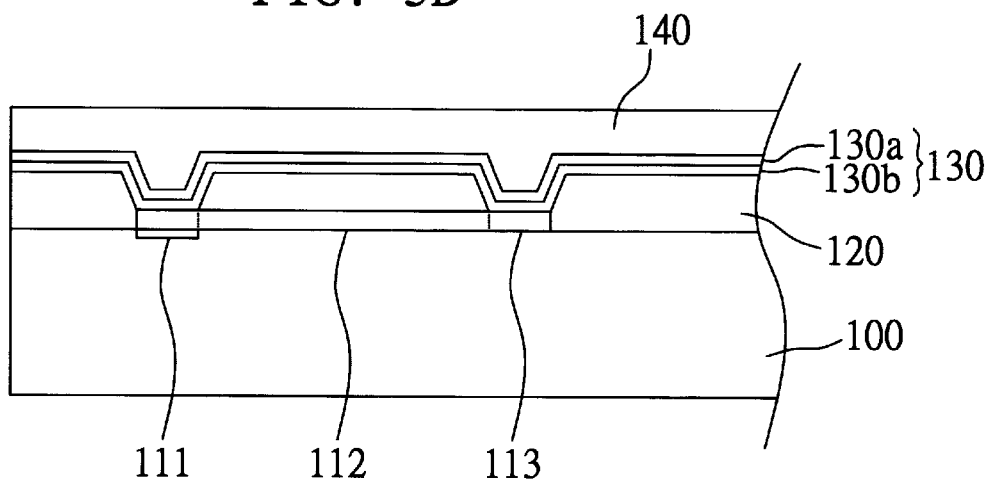

Referring further to FIG. 5D, in the next step, a photoresist layer 140 is coated over the NiV/Cu metallization structure 130. Assume low-resolution photolithographic and etching equipment is used for the required photoresist mask definition.

Figure 5E:
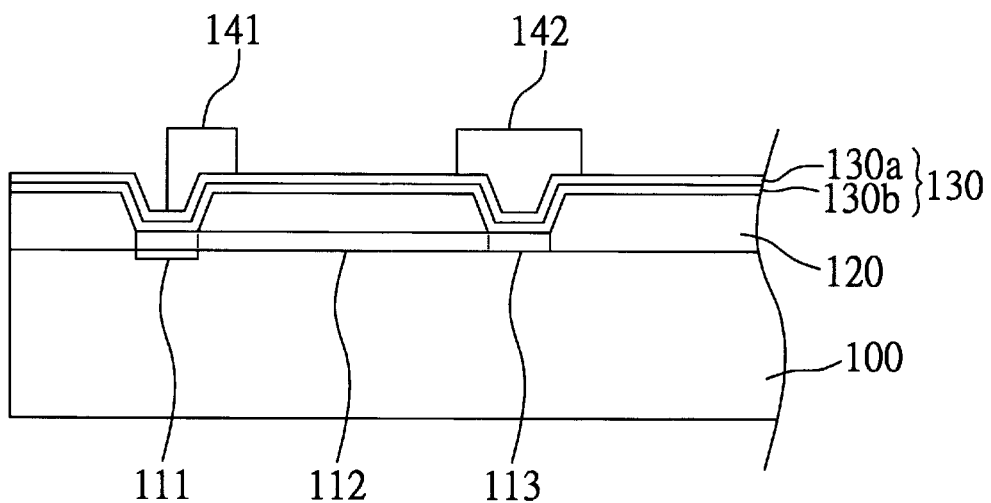

Referring further to FIG. 5E, as mentioned in the background section of this specification, through the use of the low-resolution photolithographic and etching equipment, the photoresist mask definition would result in the forming of a first photoresist block 141 which is misaligned to the PBP 111, and a second photoresist block 142 which is marginally aligned to the AAP 113.

Figure 5F:
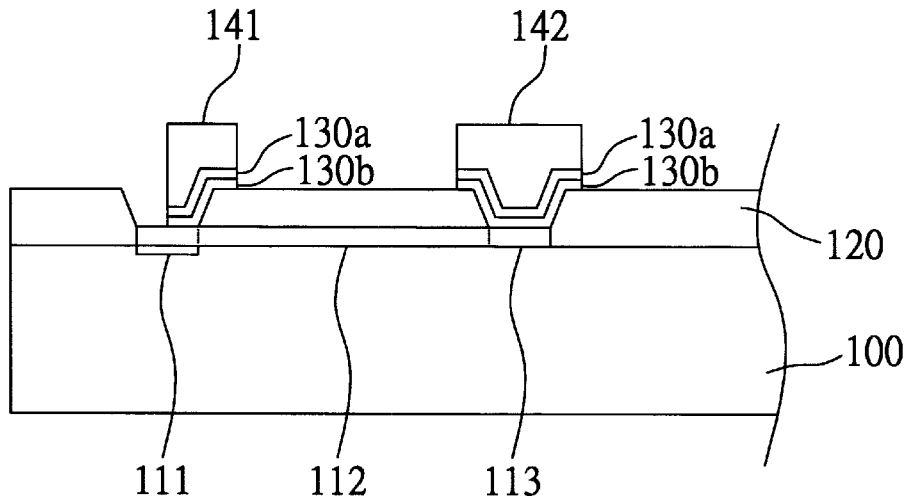

Referring further to FIG. 5F, in the next step, with the first and second photoresist blocks 141, 142 serving as mask, an etching process is performed to etch away the unmasked portions of the NiV/Cu metallization structure 130 by using a NiV/Cu specific etchant, such as a solution of $HNO_3$ and $CH_3COOH$, which can etch into copper and nickel-vanadium layer but not into aluminum. As a result, this etchant would etch away all the unmasked portions of the copper layer 130a and the nickel-vanadium layer 130b until exposing the top surface of the passivation layer 120 and the unmasked portion of the aluminum-based PBP 111. Since the solution of $HNO_3$ and $CH_3COOH$ is non-etching to aluminum, the aluminum-based PBP 111 would remain intact.

Figure 5G:
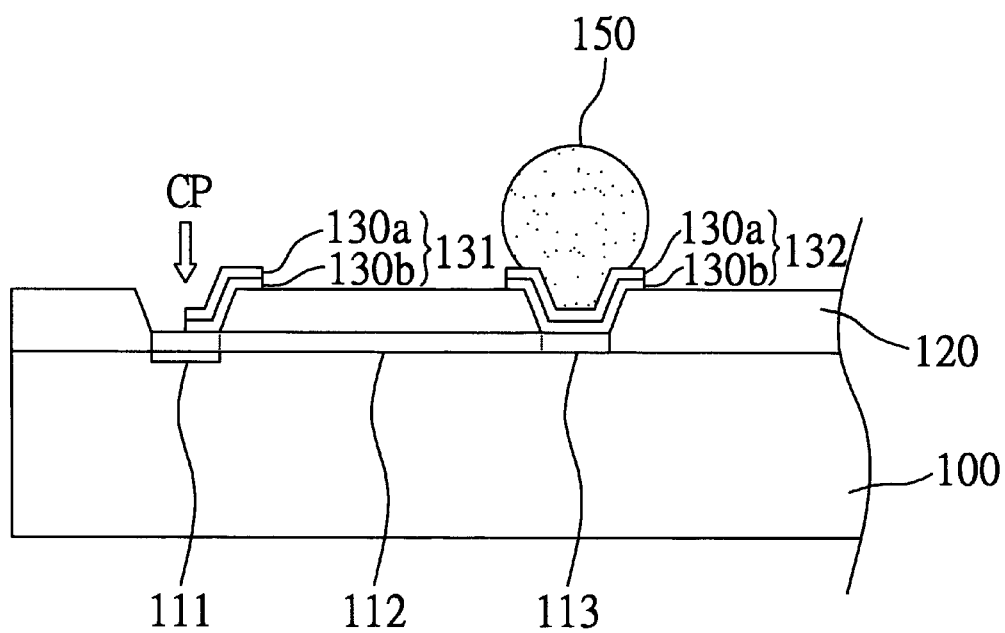

Referring further to FIG. 5G, in the final step, the first and second photoresist blocks 141, 142 are entirely removed. The remaining part of the NiV/Cu metallization structure 130 laid over the PBP 111 (as the part designated by the reference numeral 131) serves as a CP contact point, while the remaining part of the NiV/Cu metallization structure 130 laid over the AAP 113 (as the part designated by the reference numeral 132) serves as a UBM pad for attachment to a solder bump 150.

This completes the fabrication of a CP contact point 131 on the PBP 111 as well as a UBM pad 132 on the AAP 113 for solder-bump attachment. The provision of the CP contact point 131 then allows the use of PBP-dedicated probing card to perform circuit probing to the internal circuitry of the semiconductor substrate 100.

In conclusion, the invention provides a method for forming CP contact points on fine pitch PBPs on a flip chip, which allows misaligned photoresist masking on PBPs not to cause damage to the unmasked portions of the aluminum-based PBPs when low-resolution photolithographic and etching equipment is used for the photoresist mask definition. This benefit allows the fabrication to use existing low-resolution photolithographic and etching equipment (i.e., aligner and wet etching machine) without having to purchase expensive high-resolution equipment (i.e., stepper and dry etching machine), thus allowing the fabrication to be cost-effective to implement.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor fabrication process for forming a circuit-probing contact point over an aluminum-based peripheral bond pad covered by a passivation layer over a flip chip, comprising the steps of:
    (1) forming an opening in the passivation layer to expose the aluminum-based peripheral bond pad;
    (2) forming a NiV/Cu metallization structure including a layer of nickel-vanadium layer deposited over the passivation layer and over the aluminum-based peripheral bond pad through the openings in the passivation layer, and a layer of copper deposited over the nickel-vanadium layer;
    (3) coating a photoresist layer over the NiV/Cu metallization structure;
    (4) performing a selective removal process on the photoresist layer in such a manner as to allow a remaining photoresist block to mask the part of the NiV/Cu metallization structure that is laid over the aluminum-based peripheral bond pad; and (5) with the remaining photoresist block serving as mask, performing an etching process by using a NiV/Cu specific etchant that can etch into nickel-vanadium and copper but not into aluminum to etch away the unmasked portions of the NiV/Cu metallization structure until exposing the passivation layer and the aluminum-based peripheral bond pad;

wherein the remaining portion of the NiV/Cu metallization structure laid over the aluminum-based peripheral bond pad serves as the intended circuit-probing contact point.

2. The semiconductor fabrication process of claim 1, wherein in the step (5), the NiV/Cu specific etchant is a solution of $HNO_3$ and $CH_3COOH$.

3. A semiconductor fabrication process, comprising the steps of:

(1) preparing a semiconductor substrate;

(2) forming a peripheral bond pad from aluminum and an area array pad connected via a re-distribution layer to the peripheral bond pad;

(3) forming a passivation layer over the substrate to cover the peripheral bond pad and the area array pad; the passivation layer being formed with a first opening to expose the peripheral bond pad and a second opening to expose the area array pad;

(4) forming a NiV/Cu metallization structure including a layer of nickel-vanadium layer deposited over the passivation layer and over the peripheral bond pad and the area array pad through the first and second openings in the passivation layer, and a layer of copper deposited over the nickel-vanadium layer;

(5) coating a photoresist layer over the NiV/Cu metallization structure;

(6) performing a selective removal process on the photoresist layer in such a manner as to allow a first remaining photoresist block to mask the part of the NiV/Cu metallization structure that is laid over the peripheral bond pad, and a second remaining photoresist block to mask the part of the NiV/Cu metallization structure that is laid over the area array pad; and (7) with the first and second remaining photoresist blocks serving as mask, performing an etching process by using a NiV/Cu specific etchant that can etch into nickel-vanadium and copper but not into aluminum to etch away the unmasked portions of the NiV/Cu metallization structure until exposing the passivation layer and the peripheral bond pad and the area array pad;

wherein the remaining portion of the NiV/Cu metallization structure laid over the peripheral bond pad serves as a circuit-probing contact point, while the remaining portion of the NiV/Cu metallization structure laid over the area array pad serves as an under-bump-metallization pad.

4. The semiconductor fabrication process of claim 3, wherein in the step (7), the NiV/Cu specific etchant is a solution of $HNO_3$ and $CH_3COOH$.

* * * * *